(12) United States Patent
Mizrachi et al.

(10) Patent No.: US 10,540,461 B1
(45) Date of Patent: Jan. 21, 2020

(54) METHOD AND SYSTEM FOR FUNCTIONAL SAFETY VERIFICATION

(71) Applicant: Cadence Design Systems, Inc., San Jose, CA (US)

(72) Inventors: Shai Mizrachi, Ra'anana (IL); Eyal Gvili, Ramat Gan (IL)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/038,152

(22) Filed: Jul. 17, 2018

(51) Int. Cl.
*G06F 17/50* (2006.01)
*G06K 9/62* (2006.01)
*G06F 16/901* (2019.01)

(52) U.S. Cl.
CPC ...... *G06F 17/5022* (2013.01); *G06F 16/9027* (2019.01); *G06K 9/6267* (2013.01)

(58) Field of Classification Search
USPC ........................................................ 716/106
See application file for complete search history.

(56) References Cited

U.S. PATENT DOCUMENTS

| | | | | |
|---|---|---|---|---|
| 8,595,680 B1 * | 11/2013 | Steinberg | ............ | G06F 17/5022 211/105 |
| 2015/0248611 A1 * | 9/2015 | vanderZweep | ......... | G06F 16/93 706/11 |

* cited by examiner

*Primary Examiner* — Bryce M Aisaka
(74) *Attorney, Agent, or Firm* — Pearl Cohen Zedek Latzer Baratz LLP (57) ABSTRACT

A method for functional safety verification for use in a verification of a design under test (DUT), includes obtaining a set of verification tests previously executed on the DUT and related execution data; injecting a fault into each of the tests of the set of verification tests; analyzing a hierarchy tree representation of the DUT from top down to identify clusters of faults under child nodes of the hierarchy tree; and for each of the clusters of faults, based on the execution data, performing test ordering of tests from the set of verification tests according to likelihood of classifying the faults under the child node in which that cluster is located.

17 Claims, 5 Drawing Sheets

METHOD AND SYSTEM FOR FUNCTIONAL SAFETY VERIFICATION

FIELD OF THE INVENTION

The present invention relates to electrical design verification and particularly to methods and systems for functional safety verification.

BACKGROUND

Design verification is a common process for testing a newly designed integrated circuit, board, or system-level architecture, to, for example, confirm that it complies with the requirements defined by the specification of the architecture for that device. Design verification for a device under test (DUT) may be performed on the actual device, but can usually be a simulation model of the device is tested.

Verification of electronic designs may typically have three forms. At an early stage, before the electronic design is implemented in hardware, simulation can be conducted on a model of the design. Another form can be emulation, in which an electronic hardware may be used to mimic the behavior of another (tested) electronic hardware. At more advanced stages of design development, a system on chip (SoC) may be validated, in a process which is typically referred to as post-silicon validation. Post-silicon validation can be a last stage in the electronic design development, for example, before it is manufactured.

An electronic system (e.g., a smartphone, a tablet, etc.) may typically be made up of a plurality of electronic devices (e.g., memory, camera, central processing unit—CPU, graphical processing unit—GPU, microphone, media player, etc.). At the early stages in the development of an electronic design, a model of each of the electronic devices that form the electronic system can be built (typically in Verilog or other HDL language, and verified by simulating executions of a multitude of tests on the simulation of the DUT. In order to, for example, efficiently cover all (or substantially all) functionalities of the DUT a plurality of tests can be generated. The plurality of tests can be pieces of code, e.g., C-code, assembly, and/or other codes as are known in the art. Each of the plurality of tests can be generated from one of various scenarios which can be constructed by a one or a plurality of users. Each scenario can be made up of a plurality of actions which the user selects to be included in the scenario. The user may also define the order in which the selected actions are to be performed—consecutively or concurrently.

In a typical verification process an electronic design undergoes test regressions which includes designing various validated testing scenarios that are generated in a test code form and executed, in order to find bugs in the design.

Developing a SoC for the automotive market, for example, may demand a different verification approach than the verification approach used in markets such as consumer products. Whereas it may be enough to show that a consumer product does not have any functional bugs, an automotive design may require showing that it does not have any functional safety issues, even if the SoC enters an unexpected state.

To comply with safety standards (e.g., ISO 26262), SoCs that are required to pass safety verification, e.g., SoCs designed for automotive use, may require ensuring that there are no design bugs in the SoCs (e.g., using coverage-driven functional verification), and also that there are no safety risks, such as for example faults caused by an external source (e.g., radiation, physical trauma or other problems, that may cause, for example, an illegal value to appear. Safety risks may be dealt with by employing a functional safety verification strategy that complies with the safety standard/s.

Typically, a functional safety verification strategy may involve employing a fault injection technique, and checking whether the injected fault has caused an unexpected output, and/or whether specific checker or checkers have detected the fault.

SUMMARY

There is thus provided, according to some embodiments of the present invention, a method for functional safety verification for use in a verification of a design under test (DUT). The method may include obtaining a set of verification tests previously executed on the DUT and related execution data. The method may also include injecting a fault into each of the tests of the set of verification tests. The method may also include analyzing a hierarchy tree representation of the DUT from top down to identify clusters of faults under child nodes of the hierarchy tree; and, for each of the clusters of faults, based on the execution data, performing test ordering of tests from the set of verification tests according to likelihood of classifying the faults under the child node in which that cluster is located.

According to some embodiments of the present invention, the method includes, for two or more selected clusters of the clusters of faults, based on the execution data, performing test ordering of tests from the set of verification tests according to likelihood of classifying the faults under the child node in which these clusters are located.

According to some embodiments of the present invention, the performing of the test ordering comprises ranking based on toggle coverage.

According to some embodiments of the present invention, the method includes obtaining a user-defined percentage of faults of all of the injected faults in the design that constitutes a fault cluster.

According to some embodiments of the present invention, the identifying of the clusters includes identifying a child node in the DUT under which the number of faults amounts to substantially about the user-defined percentage.

According to some embodiments of the present invention, the identifying of the clusters comprises identifying a child node in the DUT under which the number of faults is significantly bigger than the user-defined percentage, the method further comprising selecting a child node under the identified child node under which a smaller cluster of the faults is located.

According to some embodiments of the present invention, the identifying of the clusters comprises identifying a child node in the DUT under which the number of faults is significantly smaller than the user-defined percentage, the method further comprising adding that small number of faults to a leftover bin.

According to some embodiments of the present invention, the method includes executing the ordered verification tests on the DUT.

According to some embodiments of the present invention, there is provided a non-transitory computer readable storage medium for functional safety verification for use in a verification of a design under test (DUT), having stored thereon instructions that when executed by a processor will cause the processor to: obtain a set of verification tests previously executed on the DUT and related execution data; inject a fault into each of the tests of the set of verification tests; analyze a hierarchy tree representation of the DUT from top down to identify clusters of faults under child nodes of the hierarchy tree; and for each of the clusters of faults, based on the execution data, perform test ordering of tests from the set of verification tests according to likelihood of classifying the faults under the child node in which that cluster is located.

According to some embodiments of the invention, there is provided a system for functional safety verification for use in a verification of a DUT, that includes a memory and a processor configured to: obtain a set of verification tests previously executed on the DUT and related execution data; inject a fault into each of the tests of the set of verification tests; analyze a hierarchy tree representation of the DUT from top down to identify clusters of faults under child nodes of the hierarchy tree; and for each of the clusters of faults, based on the execution data, perform test ordering of tests from the set of verification tests according to likelihood of classifying the faults under the child node in which that cluster is located.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF EMBODIMENTS
OF THE INVENTION

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Fault injection is a technique that may be used in verification, for example, for improving the coverage of a test, by introducing a fault or faults in test code paths (e.g., error handling paths) that may otherwise go unchallenged by regular tests. While a tested design may be found to have no bugs, a fault may occur in the normal course of action of the design. For example, external radiation, electromagnetic interference, power supply disturbances, etc. may cause illegal, irregular or unanticipated value to be registered in memory, or other fault to occur, all of which is not addressed in regular verification tests. In many cases fault injection is used with stress testing and is considered as an important verification tool for ensuring robustness of the tested software or DUT.

The propagation of a fault through to an observable failure can follow a well-defined cycle. When executed, a fault may cause an error, e.g., an invalid state within a system boundary. An error may cause additional errors to occur within that system boundary, causing each such error to act as a fault, and/or propagate to the system boundary and become observable. Errors observed at the system boundary are usually referred to as failures. A fault-error-failure mechanism is thus established, playing an important role in determining dependability of the tested system.

As part of the fault injection process, each fault from a set of faults for injection is typically injected into each test of a set of verification tests, yielding a fault-test matrix. Fault injection is aimed at classifying the safety level of the fault and determining how well it is covered in a particular set of regression tests.

Due to the typically very large size of a fault-test matrix, various optimizations may be performed, such that not all fault-test combinations in the fault-test matrix have to be performed.

For example, in test ordering optimization, injecting a fault into a given test may be sufficient to classify the fault, so no additional injecting of faults may be required. Test ordering can be used to order the tests in terms of precedence of likelihood to classify the fault, e.g., the more likely a test to classify a fault, the closer it is placed to the beginning of the test list. To assess likelihood, heuristics, such as rank based toggle coverage, may be used. Rank based toggle coverage may provide indication as to how broadly a test toggles the inputs, and can examine the outputs of components of a DUT. Coverage ranking heuristics may be used in the process of test ordering (to rank how well a test classifies a fault) since a fault in a design is typically realized in the form of a stuck value in the design wires, and a test that probes those wires is likely to recognize a fault. Typically it is desired to identify tests that for a given fault, are more likely, when executed, to cause detection of the fault by checker/s of the DUT.

To date, an entire set of tests that were executed in a previously run regression session with coverage based rating is considered for test ordering. Data on the previously executed regression may provide information on the paths taken by each test to determine coverage. Since faults are scattered in various parts of the design hierarchy tree, a single test ordering may not be good enough in optimizing the classification of all faults in the design.

Figure 1:
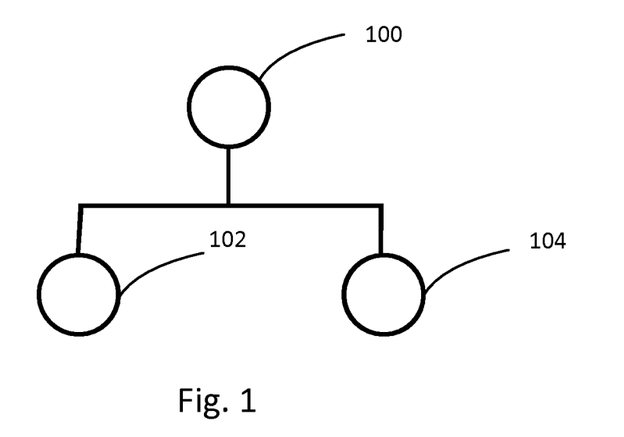
FIG. 1 is an illustration of a basic hierarchy tree representing a DUT, according to some embodiments of the present invention.

For example, consider the hierarchy tree representing a DUT shown in FIG. 1.

The graph (hierarchy tree) representation 100 of a DUT may generally include a top instance node 102 with two parallel child nodes of instances 104 and 106. For a test ordering optimized for faults in the entire hierarchy tree a certain order of tests (e.g., 1, 2, 3, 4) may be determined, yet, for the faults under a lower instance (e.g., 104 or 106) that test order may not necessarily be the optimized order. This may be because while the coverage rating of certain tests for faults in the entire design under node 102 relates to all faults in that part of the design, the local distribution of faults within the design under lower, child nodes may require a different test order, depending on the location of faults under each of these lower child nodes (104 and/or under node 106).

Verification tests may often focus on a specific area of the design, so their effectiveness and relevance may vary, depending on their focal area of interest. So, faults within a certain area of the design, under a specific child node may be better classified by certain tests, while faults in other parts of the design may be better classified using other tests.

It is suggested, according to some embodiments of the present invention, to relate to subsets of the design, and perform test ordering on parts of the design under selected nodes, which may yield a more optimized test order for faults under each of these nodes, better matching the characteristics of the faults under that node.

From test ordering perspective, it may be wise to perform test ordering per each test, yet, as ranking is a costly action in terms of time and processing power, it is typically not recommended to perform fault injection activity per each fault. Fault clustering based on the location of faults in the design, according to some embodiments of the invention, makes it feasible in terms of time and processing power to perform fault clustering per each cluster of faults, by focusing on a part of the design when the faults of interest are located.

According to some embodiments of the present invention, a fault clustering algorithm may be used, that allows a user to perform test ordering on a cluster of choice.

Such algorithm may include:

a) Obtain from a user X %, which is the percentage of faults of all of the injected faults in the design as defined by the user that constitutes a fault cluster;

b) Analyze the tree from top down to identify fault clusters. For every node: if F % (F % is defined as the percentage of faults under a specific child node (sub-tree) of the design graph with respect to all faults in that design) amounts to substantially about X % (that is within a given range of percentage in which X % exists), consider all faults under this node as cluster. If F % is significantly bigger than X %, go down the tree to find a child node under which a smaller cluster of the faults is located. If F % is significantly smaller than X %, i.e. residing faults cannot constitute a cluster, then add the small number of faults to the 'leftover' bin, which is the lowest possible.

Figure 2:
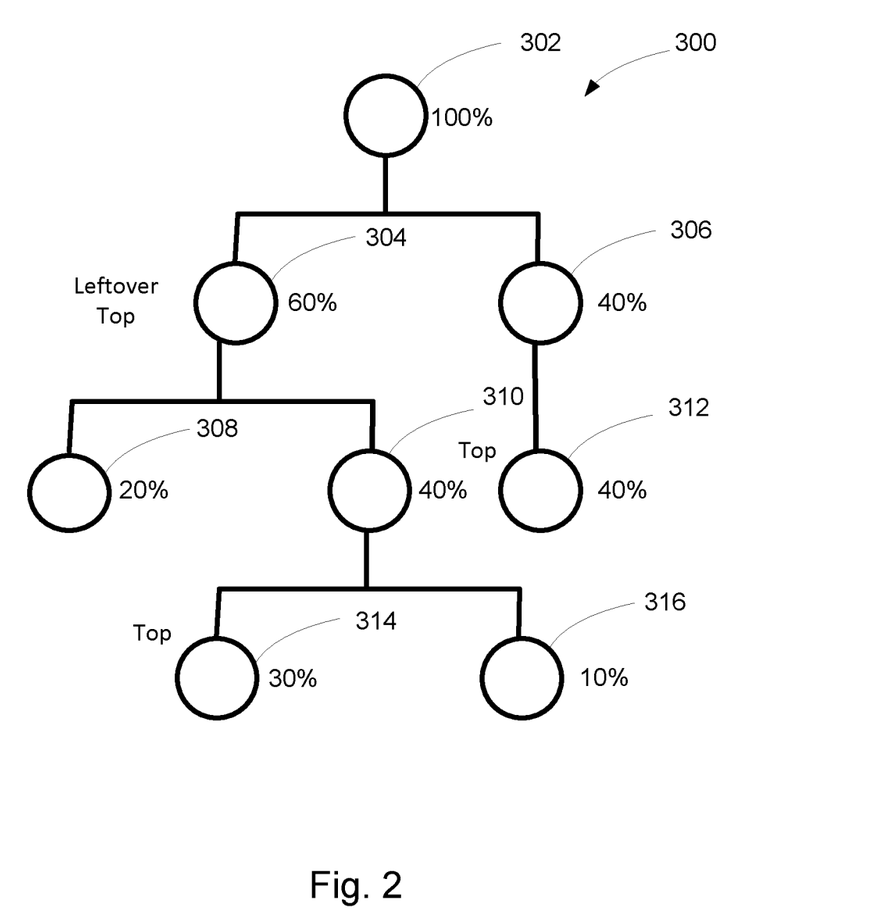
FIG. 2 is an illustration of a hierarchy tree representing a DUT, showing percentage of faults under each node of the tree, according to some embodiments of the present invention.

For every cluster perform test ordering (e.g., rank based on toggle coverage) relating to that cluster In pseudo-code, such algorithm may look like:
1. Set NODE=top node
2. For each CHILD of NODE:
   2.1. If CHILD(F %)~X % then
      2.1.1. add CHILD to LOCAL_FAULT_TOP_LIST
   2.2. If CHILD(F %)<<X % then
      2.2.1. Add CHILD to LEFTOVER_TOP_LIST
      2.2.2. Add all faults under CHILD to LEFTOVER_FAULTS
   2.3. If (CHILD)>>X % then
      2.3.1. If CHILD has children then
         2.3.1.1. set NODE=CHILD and repeat 2 recursively.
      2.3.2. Else
         2.3.2.1. Add CHILD to LOCAL_FAULT_TOP_LIST
3. Find lowest mutual parent of all tops in LEFTOVER_TOP_LIST and add it to LOCAL_FAULT_TOP_LIST
4. For each TOP in LOCAL_FAULT_TOP_LIST:
   4.1. Perform rank based on Toggle Coverage of TOP
   4.2. If TOP=LEFTOVER_TOP then
      4.2.1. Take LEFTOVER_FAULTS as subset
   4.3. else
      4.3.1. Take all faults under TOP as fault subset FIG. 2 is an illustration of a hierarchy tree 300 representing a DUT, showing percentage of faults under each node of the tree, according to some embodiments of the present invention.

The percentage numbers adjacent to each of the nodes indicates the percentage of faults of the total number of faults in the entire DUT.

Hierarchy tree 300 includes a top node 302. All of the faults are located under top node 302, which is indeed indicated as 100%. Below top node 302 are located two child nodes—child node 304 (60%) and child node 306 (40%). Node 306 has under it a child node 312 (40%). Node 304 has under it two child nodes 308 (20%) and 310 (40%). Node 310 has under it child nodes 314 (30%) and 316 (10%). Note that the sum of the percentages of all of the child nodes at a certain hierarchy level are equal to the percentage of the parent node one level up.

Assuming a user provides a user-defined percentage of faults of all of the injected faults in the design that constitutes a fault cluster, e.g., 30%, in analyzing the hierarchy tree from top down, the nodes at the level below the top node each have a bigger percentage of faults than the user-defined number, so the analysis goes further down, identifying node 312 as a top node of a cluster of faults. Node 308 below node 304 has 20% faults, but as there are no more nodes underneath it—it is identified as a cluster node. Similarly node 314 is identified as a cluster node, whereas node 316 (10%) and node 308 are found to have much less than 30%, so node 304 becomes leftover top node.

In the example depicted in FIG. 2, the analysis resulted in roughly 1/X % nodes being identified as containing clusters of faults, and each cluster has its own set of ordered tests.

In fault injection the user may specify the maximal number of tests each fault is to be injected into. Some of these test lists may contain the same tests, in which case the distinctly separated fault clusters may be reunited.

Figure 3:
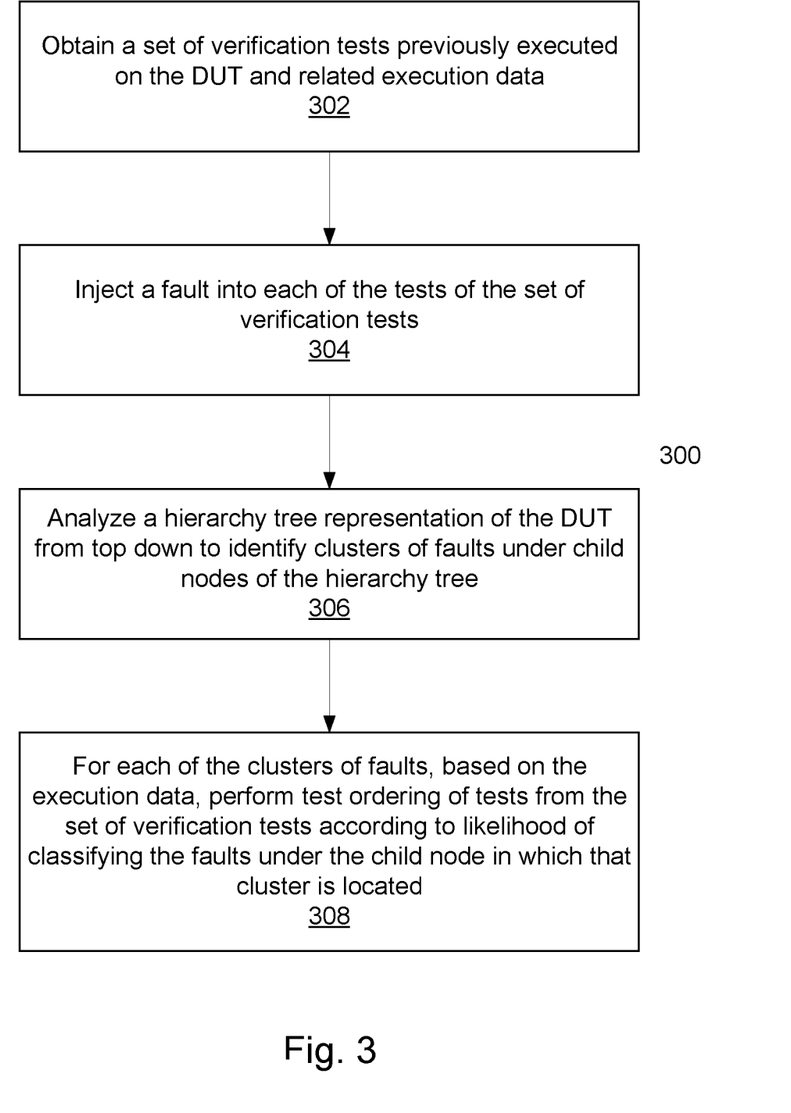
FIG. 3 illustrates a method for functional safety verification for use in a verification of a design under test (DUT), according to some embodiments of the present invention.

FIG. 3 illustrates a method 300 for functional safety verification for use in a verification of a DUT, according to some embodiments of the present invention.

Method 300 may include obtaining 302 a set of verification tests previously executed on the DUT and related execution data. Method 300 may also include injecting 304 a fault into each of the tests of the set of verification tests; analyzing 306 a hierarchy tree representation of the DUT from top down, to identify clusters of faults under child nodes of the hierarchy tree; and for each of the clusters of faults, based on the execution data, performing 308 test ordering of tests from the set of verification tests according to likelihood of classifying the faults under the child node in which that cluster is located.

In some embodiments of the invention, the method may include, selecting two or more clusters of the clusters of faults, based on the execution data, performing test ordering of tests from the set of verification tests according to likelihood of classifying the faults under the child node in which these clusters are located.

In some embodiments the performing of the test ordering includes performing ranking based on toggle coverage.

In some embodiments the method includes obtaining a user-defined percentage of faults of all of the injected faults in the design that constitutes a fault cluster.

In some embodiments the identifying of the clusters includes identifying a child node in the DUT under which the number of faults amounts to substantially about the user-defined percentage.

In some embodiments the identifying of the clusters includes identifying a child node in the DUT under which the number of faults is significantly bigger than the user-defined percentage, the method further comprising selecting a child node under the identified child node under which a smaller cluster of the faults is located.

In some embodiments the identifying of the clusters includes identifying a child node in the DUT under which the number of faults is significantly smaller than the user-defined percentage, the method further comprising adding that small number of faults to a leftover bin.

In some embodiments the ordered tests may be executed on the DUT.

Figure 4:
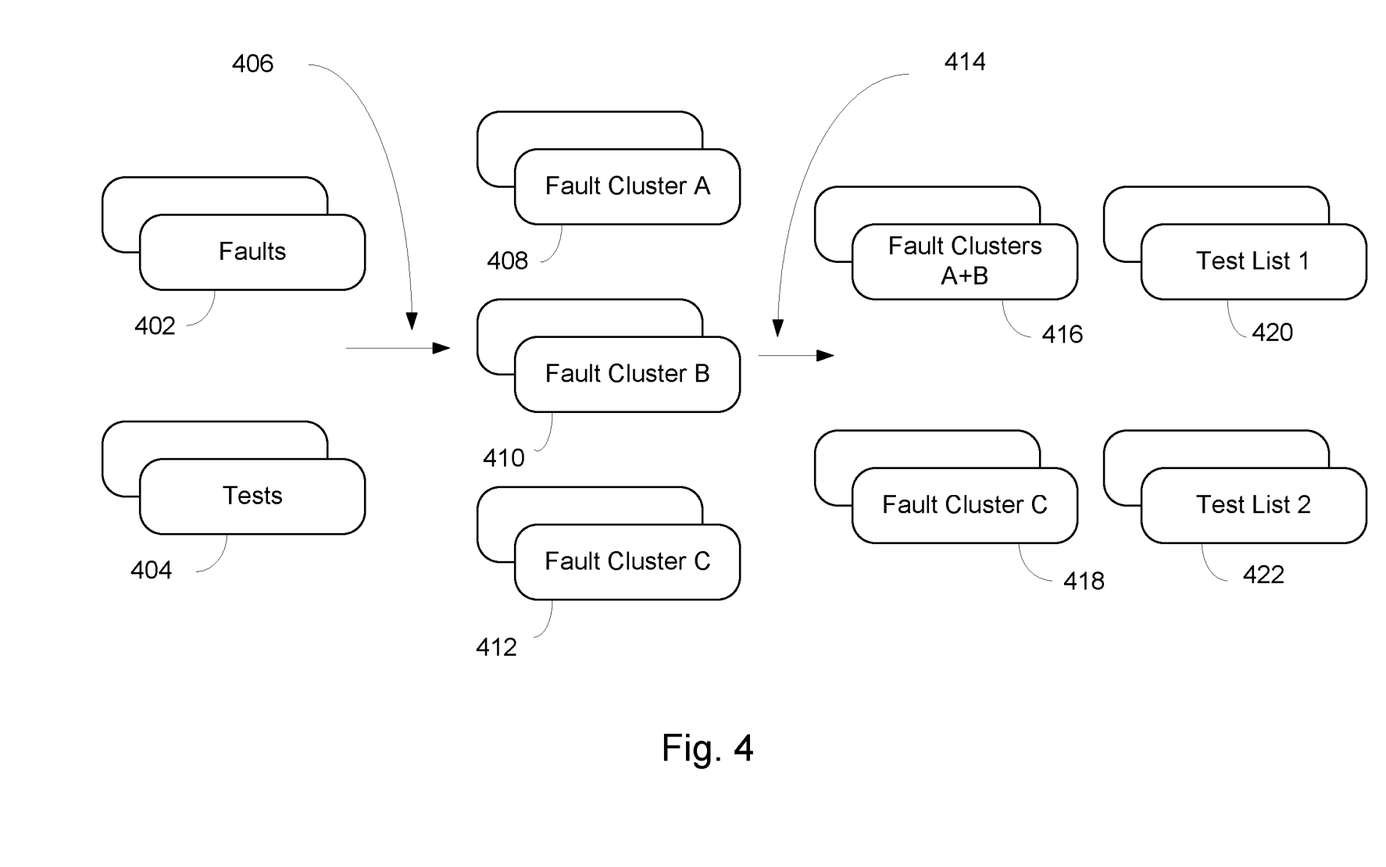
FIG. 4 shows a system for functional safety verification for use in a verification of a design under test (DUT), according to some embodiments of the present invention.

FIG. 4 is an overview of a process of ordering verification tests for use in a verification of a DUT, according to some embodiments of the present invention.

Verification tests 404 that were previously executed on the DUT may be obtained with execution data, and faults 402 may be injected into the tests. The faults are clustered, e.g., by performing 406 multiple ranking based on hierarchial path bundling (identifying local fault top), such that fault clusters 408, 410 and 412 may be identified.

Based on the clustered faults, cluster ranking 414 may be performed to re-match or re-bundle faults so as to optimize test-fault matching, which in the example of FIG. 4 results in fault clusters A and B re-bundled 416 and a matching ordered test list 420 generated, whereas cluster C 418 remains separated with a designated list of ordered tests 422.

Figure 5:
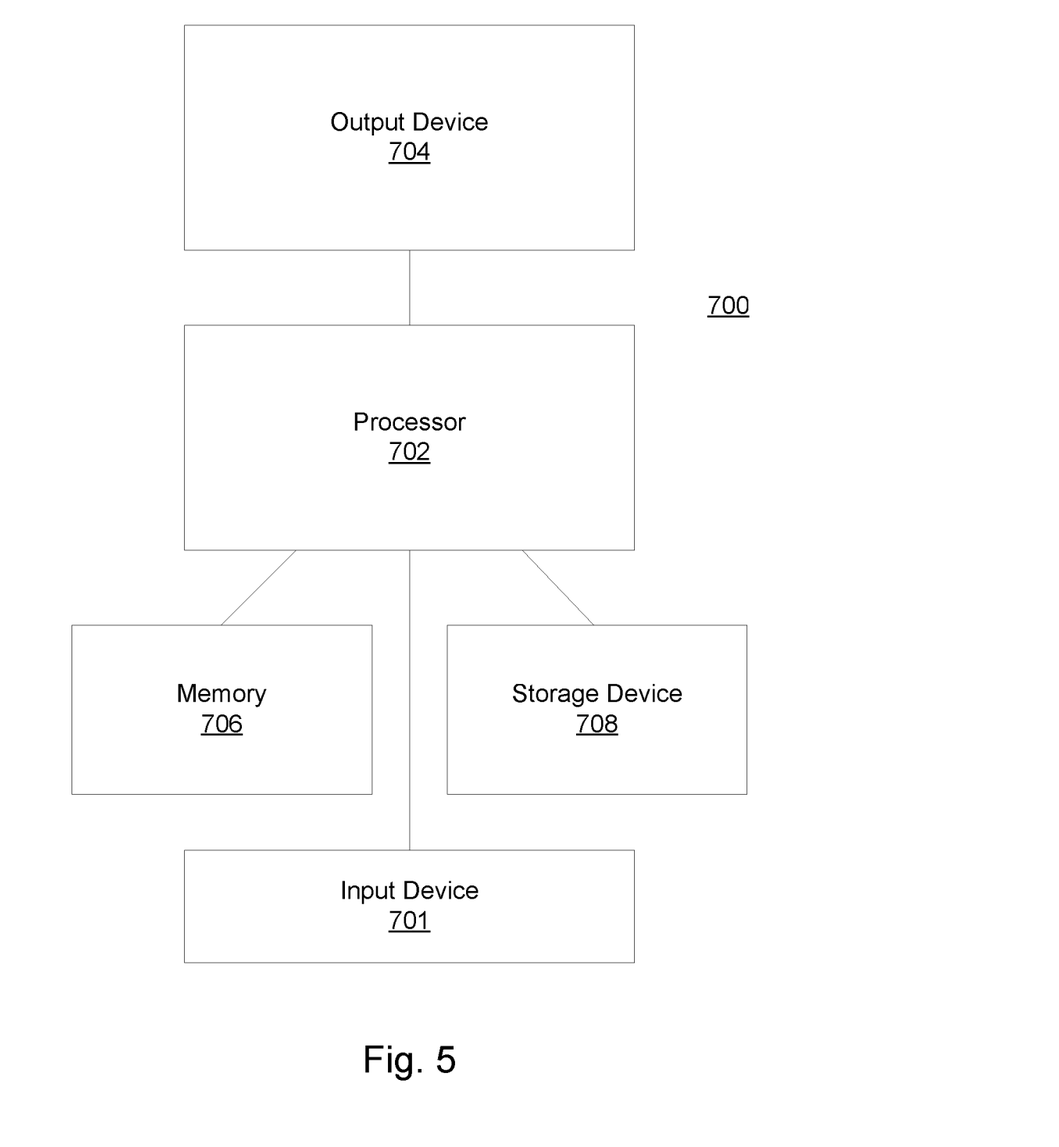
FIG. 5 shows a system 700 for ordering verification tests for functional safety verification of a DUT, according to some embodiments of the present invention.

FIG. 5 shows a system 700 for ordering verification tests for use in a verification of a DUT, according to some embodiments of the present invention. System 700 may include a processor 702 (e.g. single processor or a processing unit made that includes a plurality of processors, on a single machine or distributed on a plurality of machines) for executing a method according to some embodiments of the present invention. Processing unit 702 may be configured to perform algorithms and methods for ordering verification tests for use in a verification of a DUT, according to some embodiments of the present invention.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Methods and systems for ordering verification tests for use in a verification of a DUT, according to some embodiments of the present invention, may bring about better detection results as the ordered tests are more likely to classify the faults (e.g., based on ranking heuristics). Such methods are automatic, so the user does not have to match specific faults to tests manually. Using methods and systems for ordering verification tests for use in a verification of a DUT, according to some embodiments of the present invention, may minimize the long-tail issue, which typically requires a large number of tests to be executed to ensure coverage of faults, as the test ordering may be performed more efficiently and relevant to cluster of faults instead to the entire fault set of a design.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for functional safety verification for use in a verification of a design under test (DUT), the method comprising:
   obtaining a set of verification tests previously executed on the DUT and related execution data;
   injecting a fault into each of the tests of the set of verification tests;
   analyzing a hierarchy tree representation of the DUT from top down to identify clusters of faults under child nodes of the hierarchy tree; and
   for each of the clusters of faults, based on the execution data, performing test ordering of tests from the set of verification tests according to likelihood of classifying the faults under the child node in which that cluster is located, wherein the performing of the test ordering comprises ranking based on toggle coverage.

2. The method of claim 1, further comprising, for two or more selected clusters of the clusters of faults, based on the execution data, performing test ordering of tests from the set of verification tests according to likelihood of classifying the faults under the child node in which these clusters are located.

3. The method of claim 1, comprising obtaining a user-defined percentage of faults of all of the injected faults in the design that constitutes a fault cluster.

4. The method of claim 3, wherein the identifying of the clusters comprises identifying a child node in the DUT under which the number of faults amounts to substantially about the user-defined percentage.

5. The method of claim 3, wherein the identifying of the clusters comprises identifying a child node in the DUT under which the number of faults is significantly bigger than the user-defined percentage, the method further comprising selecting a child node under the identified child node under which a smaller cluster of the faults is located.

6. The method of claim 3, wherein the identifying of the clusters comprises identifying a child node in the DUT under which the number of faults is significantly smaller than the user-defined percentage, the method further comprising adding that small number of faults to a leftover bin.

7. The method of claim 1 further comprising executing the ordered verification tests on the DUT.

8. A non-transitory computer readable storage medium for functional safety verification for use in a verification of a design under test (DUT), having stored thereon instructions that when executed by a processor will cause the processor to:
   obtain a set of verification tests previously executed on the DUT and related execution data;
   inject a fault into each of the tests of the set of verification tests;
   obtain a user-defined percentage of faults of all of the injected faults in the design that constitutes a fault cluster;
   analyze a hierarchy tree representation of the DUT from top down to identify clusters of faults under child nodes of the hierarchy tree; and
   for each of the clusters of faults, based on the execution data, perform test ordering of tests from the set of verification tests according to likelihood of classifying the faults under the child node in which that cluster is located.

9. The non-transitory computer readable storage medium of claim 8, having stored thereon instructions that when executed by a processor will cause the processor, for two or more selected clusters of the clusters of faults, based on the execution data, to perform test ordering of tests from the set of verification tests according to likelihood of classifying the faults under the child node in which these clusters are located.

10. The non-transitory computer readable storage medium of claim 8, wherein the performing of the test ordering comprises ranking based on toggle coverage.

11. The non-transitory computer readable storage medium of claim 8, wherein the identifying of the clusters comprises identifying a child node in the DUT under which the number of faults amounts to substantially about the user-defined percentage.

12. The non-transitory computer readable storage medium of claim 8, wherein the identifying of the clusters comprises identifying a child node in the DUT under which the number of faults is significantly bigger than the user-defined percentage, the method further comprising selecting a child node under the identified child node under which a smaller cluster of the faults is located.

13. The non-transitory computer readable storage medium of claim 8, wherein the identifying of the clusters comprises identifying a child node in the DUT under which the number of faults is significantly smaller than the user-defined percentage, the method further comprising adding that small number of faults to a leftover bin.

14. A system for functional safety verification for use in a verification of a design under test (DUT), the system comprising:
   a memory and
   a processor configured to:
      obtain a set of verification tests previously executed on the DUT and related execution data;
      inject a fault into each of the tests of the set of verification tests;
      analyze a hierarchy tree representation of the DUT from top down to identify clusters of faults under child nodes of the hierarchy tree; and
      for each of the clusters of faults, based on the execution data, perform test ordering of tests from the set of verification tests according to likelihood of classifying the faults under the child node in which that cluster is located, wherein the performing of the test ordering comprises ranking based on toggle coverage.

15. The system of claim 14, wherein the processor is further configured to, for two or more selected clusters of the clusters of faults, based on the execution data, perform test ordering of tests from the set of verification tests according to likelihood of classifying the faults under the child node in which these clusters are located.

16. The system of claim 14, wherein the processor is configured to obtain a user-defined percentage of faults of all of the injected faults in the design that constitutes a fault cluster.

17. The system of claim 16, wherein the identifying of the clusters comprises identifying a child node in the DUT under which the number of faults amounts to substantially about the user-defined percentage.

* * * * *